United States Patent [19]
Lewis et al.

[11] Patent Number: 5,313,369
[45] Date of Patent: May 17, 1994

[54] REDUCED TOLERANCE INTERCONNECT SYSTEM

[75] Inventors: Mark S. Lewis; Lori A. Treseder; Reuben Martinez, all of Colorado Springs; Ralph M. Tusler, Monument, all of Colo.

[73] Assignee: Digital Equipment Corporation, Maynard, Mass.

[21] Appl. No.: 970,721

[22] Filed: Nov. 3, 1992

[51] Int. Cl.$^5$ ............................................. H05K 7/14
[52] U.S. Cl. ..................... 361/796; 361/752; 361/759; 434/61; 211/41
[58] Field of Search ............... 200/303; 211/41; 220/4.02, 4.24, 4.26; 312/9.9, 257.1, 263; 361/752, 759, 788, 796–802, 809; 439/61

[56] References Cited

U.S. PATENT DOCUMENTS

| | | | |
|---|---|---|---|
| 4,353,614 | 10/1982 | Etchinson, Jr. et al. | 361/796 |
| 4,405,972 | 9/1983 | Fiorentino et al. | 361/802 |
| 4,530,033 | 7/1985 | Meggs | 361/759 |
| 4,652,969 | 3/1987 | Stegenga | 361/796 |
| 4,878,153 | 10/1989 | Loris | 361/796 |
| 5,128,830 | 7/1992 | Deluca et al. | 361/796 |
| 5,130,887 | 7/1992 | Trelford | 361/796 |

FOREIGN PATENT DOCUMENTS

| | | | |
|---|---|---|---|
| 3323604 | 1/1985 | Fed. Rep. of Germany | 361/752 |
| 2502447 | 9/1982 | France | 361/752 |

*Primary Examiner*—Lincoln Donovan
*Assistant Examiner*—D. Sparks
*Attorney, Agent, or Firm*—Albert P. Cefalo; Ronald C. Hudgens

[57] ABSTRACT

A simple, low cost, reduced tolerance interconnect enclosure in which a blind m A siVpV:interconnect between modules and the backplane may be guaranteed without the need for assembly fixtures or floating connectors, and a method of manufacturing the enclosure. The enclosure includes two matching enclosure sections for holding a backplane. The backplane has spaced apart recesses on opposing edges. Each enclosure section includes alignment protrusions spaced apart to engage the backplane recesses. These protrusions have curved apex regions and a height greater than the depth of the backplane recesses. Means for latching the enclosure sections together are provided, and the enclosure sections are dimensioned such that when the enclosure sections are closed around the backplane, the protrusions from the enclosure sections are urged against the recesses on the backplane. The resulting multi-point-of-contact interference fit between the backplane recesses and alignment protrusions automatically centers the backplane in the shelf. The process for manufacturing the enclosure includes the steps of drilling holes in a panel and routing the backplanes from the panel such that the routing path crosses the drilled holes, creating recesses on the backplane edges. The enclosure sections are manufactured according to a unitary injection molded plastic process.

9 Claims, 8 Drawing Sheets

REDUCED TOLERANCE INTERCONNECT SYSTEM

FIELD OF THE INVENTION

This invention relates generally to blind mate interconnect systems, and particularly to a reduced tolerance enclosure providing simple, low cost blind mate interconnections.

BACKGROUND OF THE INVENTION

Blind mate interconnect systems provide automatic mating between connector elements on a backplane and connector elements on hardware modules, such as storage devices, when the modules are installed in an enclosure. The connection is typically made in an interior region of the enclosure, which is usually not easily accessible. One difficulty resulting from the use of a blind mate interconnect is assuring that the two mating connector elements are properly aligned so that the connection will be reliably made, especially in an environment requiring hot swap of components such as disk drives.

The enclosure consists of enclosure sections holding a backplane containing connectors with which the module connectors mate on installation. The backplane must be installed in the enclosure in such a way as to guarantee a proper blind mate interconnection when a module is installed. However, mechanical tolerances involved in constructing the typical enclosure and backplane assembly are larger than that which can guarantee a proper installation without special hardware or post-construction adjustments to the positioning of the backplane within the enclosure.

One present method of compensating for the large tolerance stack of the enclosure requires the use of an assembly fixture to align the backplane connectors before screwing the backplane to the shelf. Another method requires use of expensive "floating" connectors on the modules which seek out the backplane connectors. Both of these methods necessarily add greatly to the cost and complexity of the system.

SUMMARY OF THE INVENTION

It is an object of the invention to provide a new and improved enclosure in which a blind mate interconnection of a hardware module with the backplane may be guaranteed without the need for assembly fixtures or floating connectors.

It is an advantage of the invention that the enclosure includes identical, interchangeable enclosure sections and requires no screws or other hardware for securing the backplane, thus further reducing the cost and complexity of the system.

These and other objects and advantages are attained by an apparatus and method for producing a simple, low cost, reduced tolerance enclosure in which a blind mate interconnect between modules and the backplane may be guaranteed without the need for assembly fixtures or floating connectors.

Accordingly, an enclosure is provided including two matching enclosure sections for aligning and securing a backplane. The backplane has spaced apart recesses on opposing edges. Each enclosure section includes alignment protrusions spaced apart to engage the backplane recesses. These protrusions have curved apex regions and a height greater than the depth of the backplane recesses. Means for latching the enclosure sections together are provided, the enclosure sections being effective such that when the enclosure sections are closed around the backplane, the protrusions from the enclosure sections are urged against the recesses on the backplane. The resulting multi-point-of-contact interference fit between the backplane recesses and alignment protrusions automatically centers the backplane in the enclosure.

In a more specific sense, the backplane recesses and the protrusions both have arcuate contours, the apex regions of the protrusions being more arcuate than the bottoms of the recesses. When the enclosure is closed around the backplane, the protrusions are forced toward the bottom center of the recesses, creating equally opposing forces at all contact points for centering the backplane.

According to the preferred method for producing the enclosure, the recesses in the backplane are created by drilling holes in a panel from which the backplanes are routed. When a backplane is routed from the panel, the drilled holes result in arcuate recesses on the backplane edge. In practice, each enclosure section is constructed of injection molded plastic. The molding process is normally controlled such that the center portion of each enclosure section is flat to convex. The center portion also contains module guide channels for guiding the modules to the backplane connectors on installation.

Total mechanical tolerances are reduced over those of the prior art due to a number of features of the invention. First, the contact points between the backplane and enclosure sections rely on drilled holes rather than the traditional more loosely toleranced routed edge. Next, the multi-point-of-contact interference fit between the backplane and the enclosure automatically effects accurate centering of the backplane in the enclosure. Also, the single-unit injection molded plastic construction of each enclosure section allows the maintenance of tight tolerances between the module guide rails and the alignment protrusions. Finally, the intentional flat to convex contour of the center portion of each enclosure section eliminates the warpage tolerance from the enclosure.

The further benefits of reduced cost and complexity incurred by providing interchangeable enclosure sections and a system requiring no screws or extra hardware for mounting the backplane add to the advantages of this reduced tolerance blind mate interconnect system.

DETAILED DESCRIPTION OF THE PREFERRED EMBODIMENT

Figure 1:
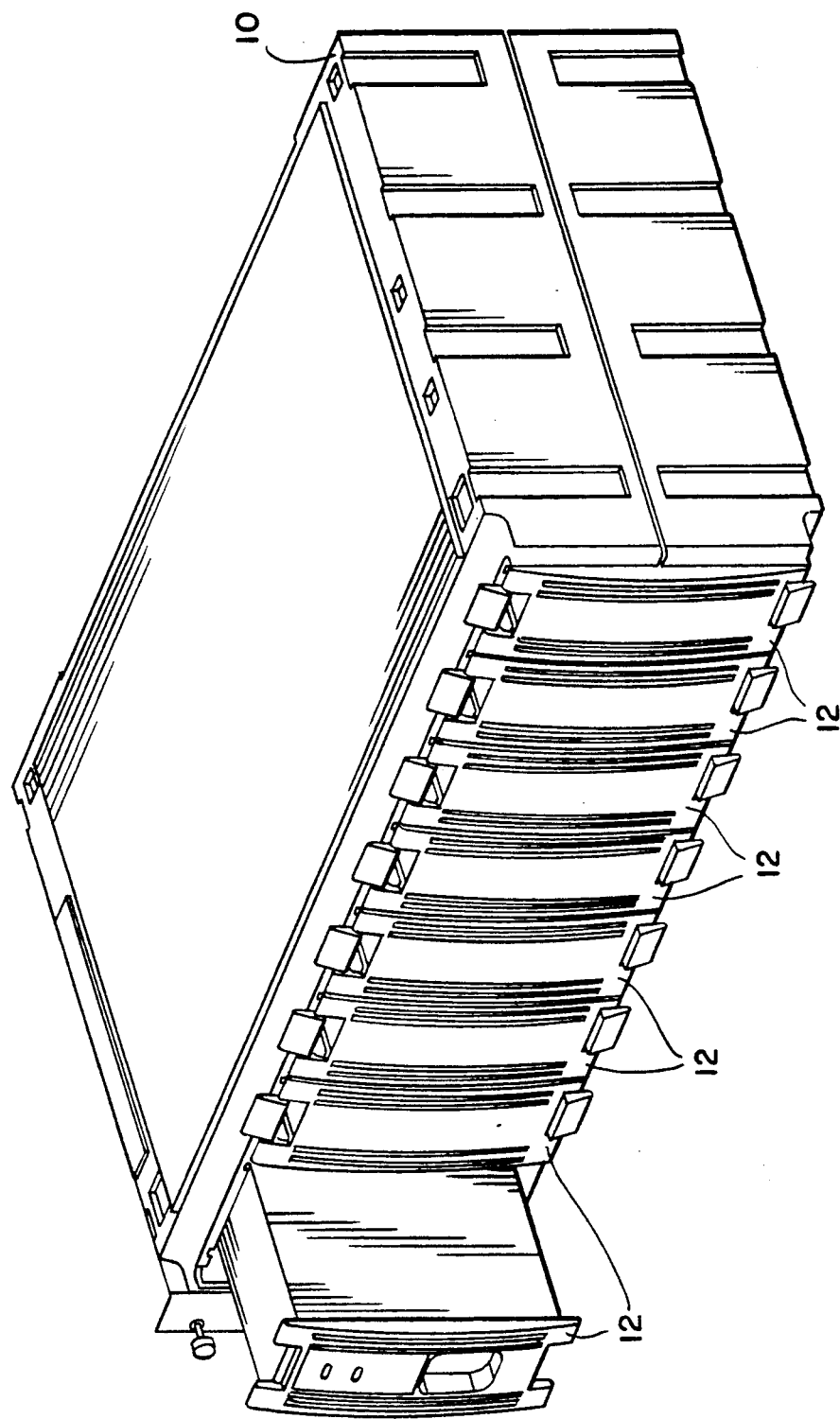
FIG. 1 is a perspective view of a loaded enclosure according to the principles of the invention.
Figure 2:
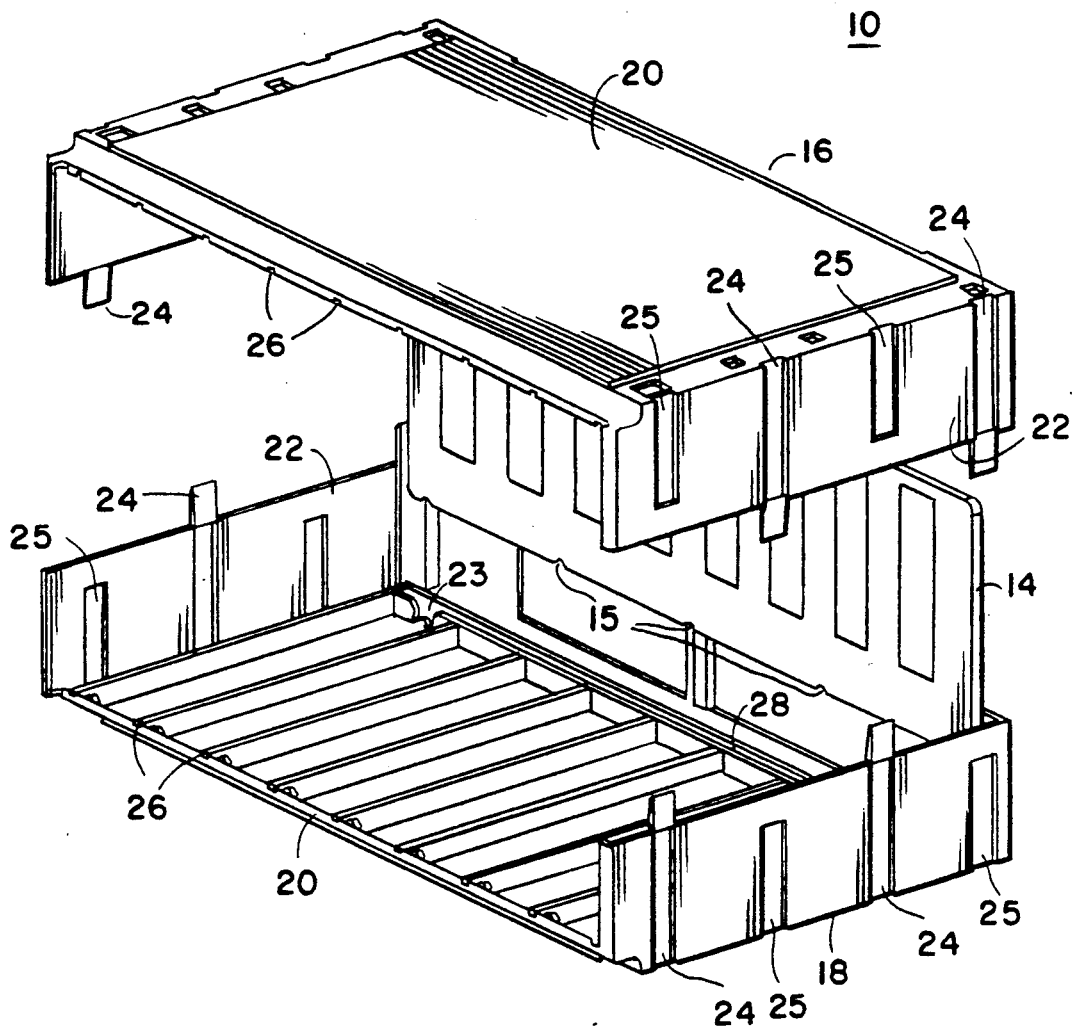
FIG. 2 is an isometric view of the enclosure of FIG. 1.

In FIG. 1 there is shown a fully loaded enclosure 10 embodying the principles of the invention, in which modules 12, which may be for example storage devices such as disk drives, are connected to a backplane 14 (see FIG. 2). The modules 12 are connected to the backplane 14 by means of a blind mate interconnection.

FIG. 2 shows an exploded view of the enclosure 10 of FIG. 1, showing a backplane 14 to which the modules 12 are electrically connected during operation. The backplane 14 includes recesses 15 spaced along opposing edges. The enclosure 10 includes enclosure sections 16 and 18, each of which as shown include a center portion 20 and end portions 22. Each of the enclosure sections 16 and 18 further includes spaced apart alignment protrusions 23, one of which is shown on the enclosure section 18 of FIG. 2, for engaging the backplane recesses 15. Means for latching the enclosure sections 16 and 18 together around the backplane are included on the end portions 22, here shown as conventional alternating male and female snap latches 24 and 25 respectively. The enclosure sections 16 and 18 are effective such that when the enclosure sections 16 and 18 are closed around the backplane 14, the protrusions 23 are urged against the recesses 15, creating an interference fit for accurately positioning and holding the backplane 14 in place within the enclosure 10.

In a more specific sense, module guide rails 26 are included on the interior portion of the center portion 20 of each of enclosure sections 16 and 18 for guiding the modules 12 towards the backplane 14 to mate with the backplane connectors. Also included near an edge of the center portion 20 of each of the enclosure sections 16 and 18 is a backplane guide channel 28, extending transversely from the module guide channels 26.

Included within the backplane guide channel 28 are spaced apart alignment protrusions 23. The alignment protrusions 23 are spaced to engage the recesses on the backplane 14 in the assembled enclosure 10. As shown, the protrusions 23 have curved apex regions and a height greater than the depth of the recesses 15 on the backplane 14.

During assembly, the backplane 14 is positioned within the backplane guide channel 28 of each enclosure section 16 and 18 such that the alignment protrusions 23 engage the bottoms of the backplane recesses 15. As shown, the enclosure sections 16 and 18 are held together by snap latches 24. The enclosure sections 16 and 18 are effective such that the backplane 14 is held in place by the urging of the alignment protrusions 23 of the enclosure sections 16 and 18 against the recesses 15 of the backplane 14.

Figure 3:
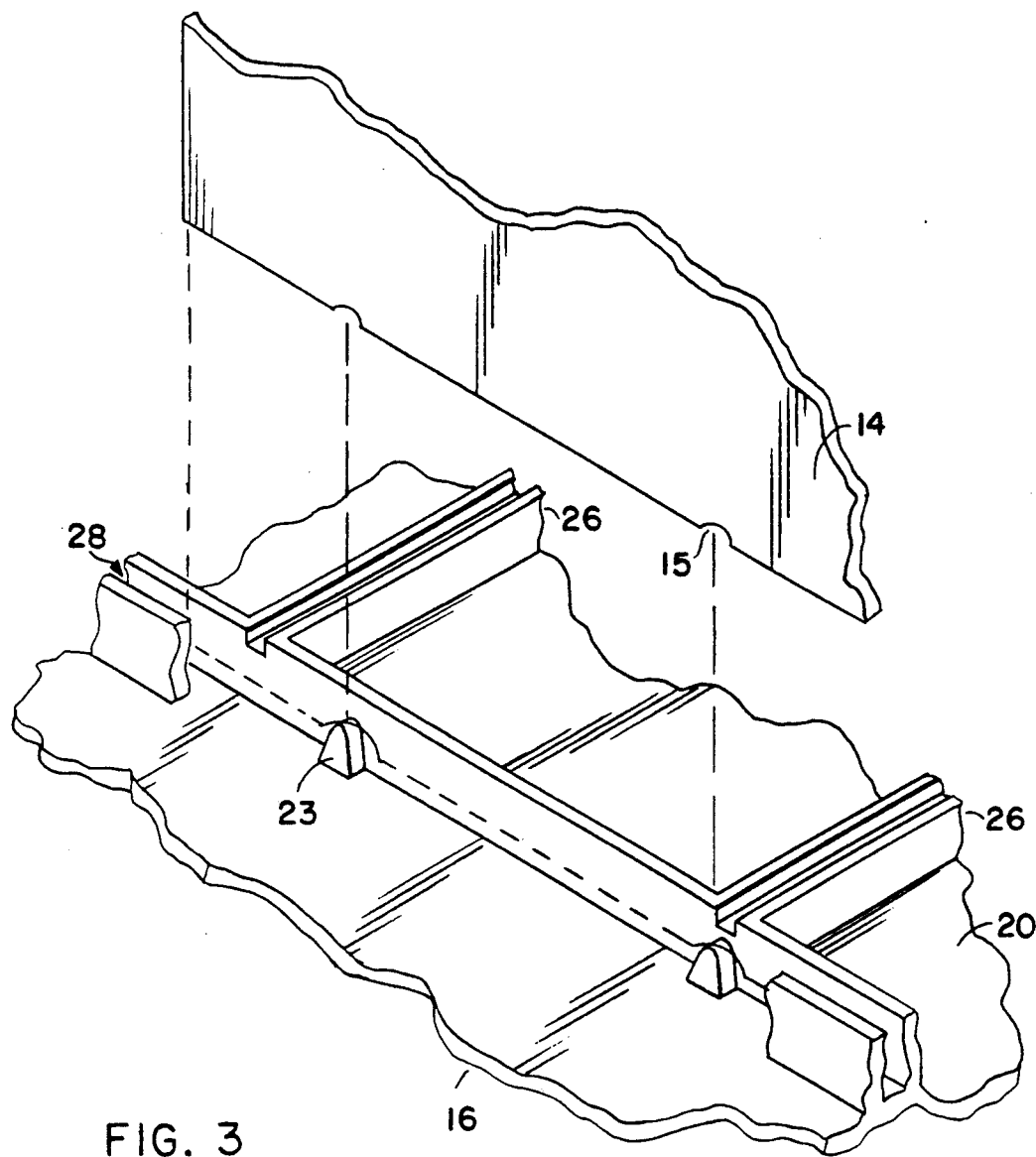
FIG. 3 is an isometric view of the center portion of one of the enclosure sections of the enclosure of FIG. 2.
Figure 3A:
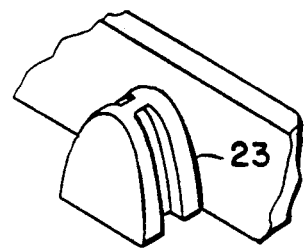
FIG. 3A is an enlarged isometric view of a protrusion shown in FIG. 3.

The cooperation between the alignment protrusions 23 and the backplane recesses 15 is more clearly delineated in FIG. 3 and FIG. 3A is an exploded view of a portion of one of the enclosure sections 16 or 18 and the backplane 14 of FIG. 1, showing in more detail the backplane guide channel 28 and alignment protrusions 23, the module guide rails 26, and the backplane recesses 15. FIG. 3A is an enlarged view of a protrusion 23.

According to the invention, the recesses 15 have a generally arcuate contour. The apex regions of the alignment protrusions 23 are also arcuate, and are more arcuate than the contact surfaces of the recesses 15. Also, the alignment protrusions 23 have a height greater than the depth of the recesses 15. This dimensioning guarantees that, when the enclosure 10 is assembled, the effective pressure points of contact between the backplane 14 and the enclosure sections 16 and 18 occur between the shelf alignment protrusions 23 and the backplane recesses 15, as is more clearly detailed by the dotted lines in FIG. 3, which represent the backplane 14 position relative to the enclosure section 18 when installed. This multi-point-of-contact interference fit serves to accurately center the backplane 14 between the enclosure sections 16 and 18.

Figure 4:
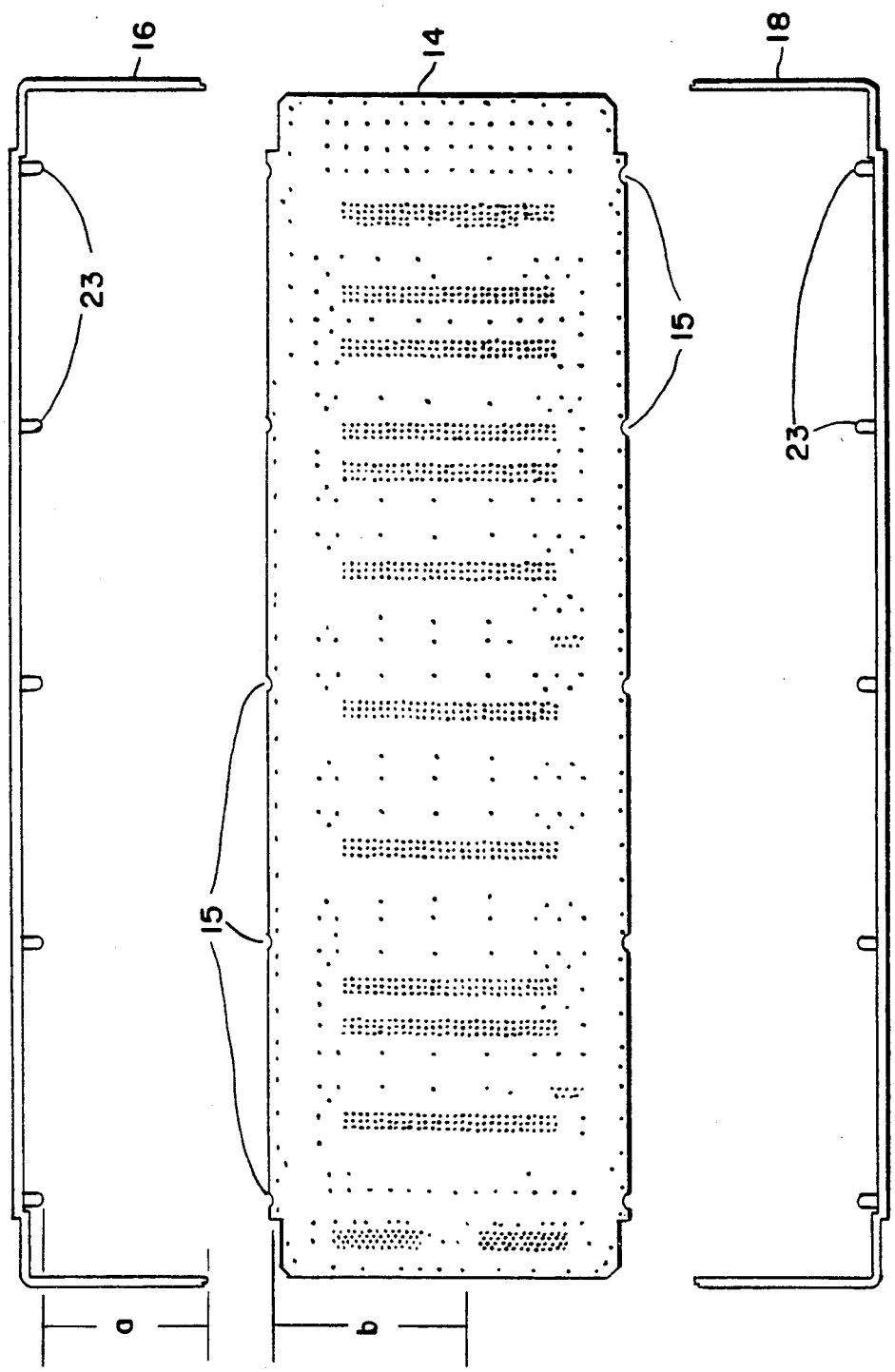
FIG. 4 is a front perspective view of the unassembled enclosure of FIG. 1.

The urging of the alignment protrusions 23 against the backplane recesses 15 has been advantageously provided by dimensional characteristics of the various parts. Referring to FIG. 4, the dimension between the end portions 22 and the apex of the protrusions 23, designated 'a' in FIG. 4, is shown as slightly less than the one-half widthwise dimension between the backplane 14 and the bottom of the recess 15, designated 'b' in FIG. 4. This dimensional difference requires that the enclosure sections 16 and 18 be forced about the backplane 14, providing the interference fit.

Also, in the embodiment shown, the center portion 20 of each of the enclosure sections 16 and 18 is flexible and may be of a flat to convex contour. In the embodiment shown in the Figures, this construction allows the enclosure sections 16 and 18 to be bent to some extent around the backplane 14 in order to fully engage the latching means 24.

Figure 5:
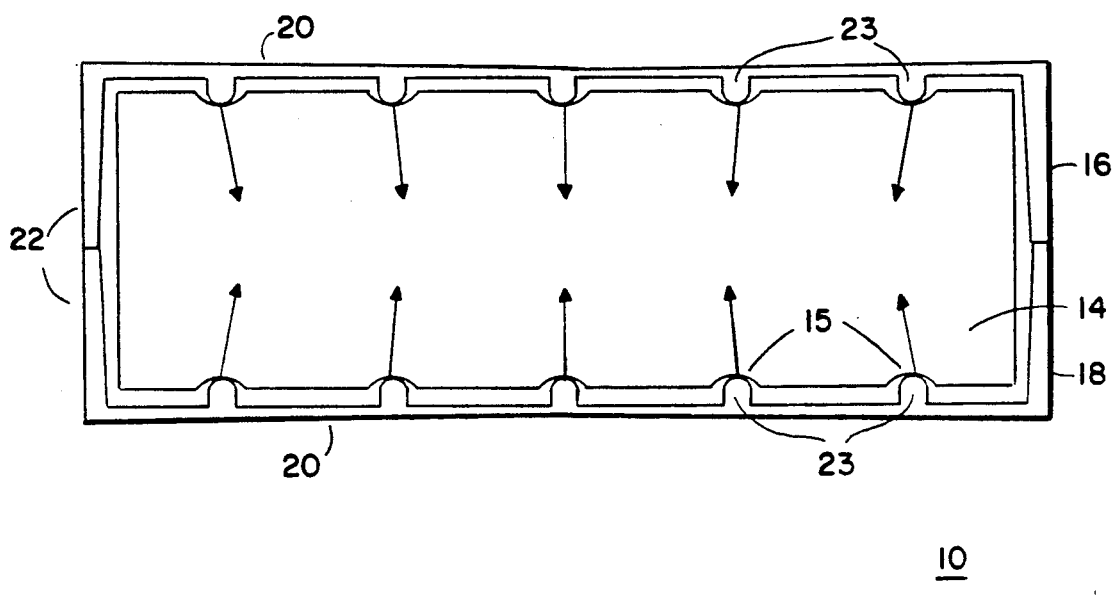
FIG. 5 is a front perspective view of the assembled enclosure of FIG. 1.

Referring to FIG. 5, in the assembled enclosure 10, the enclosure sections 16 and 18 serve to force alignment protrusions 23 towards the bottom center of the recesses 15 in the backplane 14. Moreover, as shown, the protrusions 23 and recesses 15 are aligned equidistantly along the length of the assembly 10, so equal and opposing forces are exerted by the shelf protrusions 23 against the backplane 14 at contact points within recesses 15, shown by the arrows in FIG. 5. This interference fit between the enclosure sections 16 and 18 and the backplane 14 centers the backplane 14 vertically and horizontally between the enclosure sections 16 and 18. The backplane 14 is thus held firmly in position within the enclosure 10 without the need for screws or extra mounting hardware.

Figure 6:
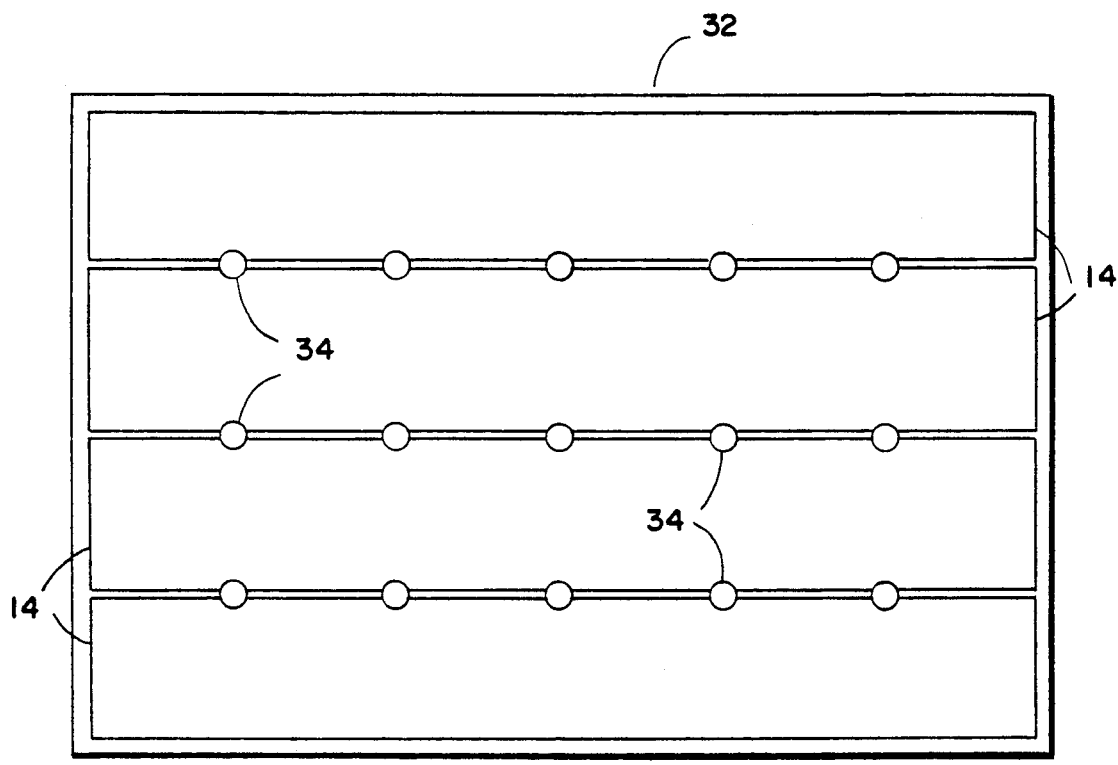
FIG. 6 is a representation of a panel of backplanes.

To obtain heightened performance from the construction of enclosure 10, methods should be used in producing the various parts that will guarantee very tight assembly tolerances so that enclosure 10 may be used in a blind-mate interconnection environment. To this end, referring to FIG. 6, backplane templates are used to drill and etch multiple backplanes on a panel 32. The recessions 15 are then created by drilling rows of drilled holes 34 under computer numerical control at precise locations on the panel, and then routed in a conventional manner, where the routing path crosses the drilled holes 34. Each resulting backplane 14 is then left with arcuate recessions 15, for example recesses that are quarter circle arcs, drilled along its edge.

It has been found convenient to drill holes 34 with a 0.250 inch diameter every 3.725 inches starting 1.100 inches from the referenced edge of the backplane 14, at a width of 5.293 ±0.005 inches from each other. The width of the backplane 14 is 5.200 inches ±0.010 inches. Thus, the distance between the bottoms of opposing recesses 15 on a given backplane 14 is 5.043 ±0.008 inches making dimension 'b' of FIG. 4 2.522±0.004 inches. (See FIG. 4).

Another step in the method of producing the high tolerance enclosure 10 involves producing identical enclosure sections 16 and 18, and is accomplished by making the enclosure sections 16 and 18 as unitary injection molded plastic pieces of a suitable plastic, for example, a glass reinforced plastic sold by General Electric Company under the trade name LEXAN.

For advantageous cooperation between the backplane 14 and the enclosure sections 16 and 18, it has been found convenient to place protrusions 23 every 3.725 inches starting 1.299 inches from a reference edge. The apex of each protrusion 23 is spaced at 2.512 inches ±0.002 inches from the end of the end portion 22 (shown as dimension 'a' of FIG. 4), which is the contact point between the enclosure sections 16 and 18 when they are latched together, and thus the midpoint of the enclosure. In such an arrangement, the space between opposing recesses 15 on the backplane is positive to 0.016 inches greater than the space between opposing protrusions 23 on the enclosure sections 16 and 18. Also, the radius of the apex of the protrusions 23 is 0.090 inches, as compared to the 0.125 inch radius of the recesses 15.

Furthermore, during the molding process, it has been found advantageous to control the temperature across the top of the center portion 20 of enclosure section 16 such that center portion 20, when finished, has a flat to slightly convex contour; convex in that end portions 22 tend to bend slightly away from each other. A favorable degree of convexity for the embodiment shown in the Figures has been found to be in the range of 0.001–0.002 inch/inch.

Means for latching the end portions of the enclosure sections together are provided as part of the unitary molded enclosure section 16. While a variety of methods may be used, it has been convenient to utilize molded male and female snap latches 24 and 25, as can be seen in FIG. 1. Each male latch 24 on one end portion 22 has a corresponding female latch 25 on the opposite end portion 22 at the same position, so that when two enclosure sections 16 and 18 are positioned to be latched together, the male latches 24 of the enclosure section 16 will engage the female latches 25 of enclosure section 18 and vice-versa.

When latching the enclosure sections 16 and 18 together around the backplane 14, the dimensional difference between the backplane recesses 15 and the alignment protrusions 23 cause the apex regions of the protrusions 23 to be urged towards top dead center of the larger radiused recesses 15. The flat to convex curvature of the center portion 20 of each enclosure section 16 and 18 allows the flexible enclosure sections 16 and 18 to bend if necessary around the backplane 14 to create the interference fit. The resulting equally opposing forces resulting at the contact points between the protrusions 23 and recesses 15 effectively hold the backplane in a horizontally and vertically centered position between the enclosure sections 16 and 18.

The resulting enclosure 10 has reduced tolerances over previous enclosures due to a combination of results of the described process. First, the contact points on backplane 14 for engaging enclosure sections 16 and 18 are drilled hole edges. Drilled holes are more tightly toleranced, on the order of thousandths of an inch, than routed edges, which are toleranced on the order of hundredths of an inch. Second, the multi-point-of-contact interference fit which centers the backplane 14 between enclosure sections 16 and 18 results in much more accurate positioning of the backplane 14 than can be achieved by relying on screws through larger diameter, relatively loosely toleranced backplane holes. Third, the flat to convex bow in the center portion 20 of each enclosure section 16 and 18 guarantees that an interference fit will occur. The tolerance of the specified bow merely effects the degree of force exerted between contact points; thus, the warpage tolerance of the mold, which normally must be accounted for, is eliminated in the invention. Fourth, the enclosure sections 16 and 18 are produced of single unit injection molded plastic. Dimensions in the injection molded process may be very tightly controlled; thus, the module guide rails 26 are spaced very accurately from the alignment protrusions 23.

Figure 7:
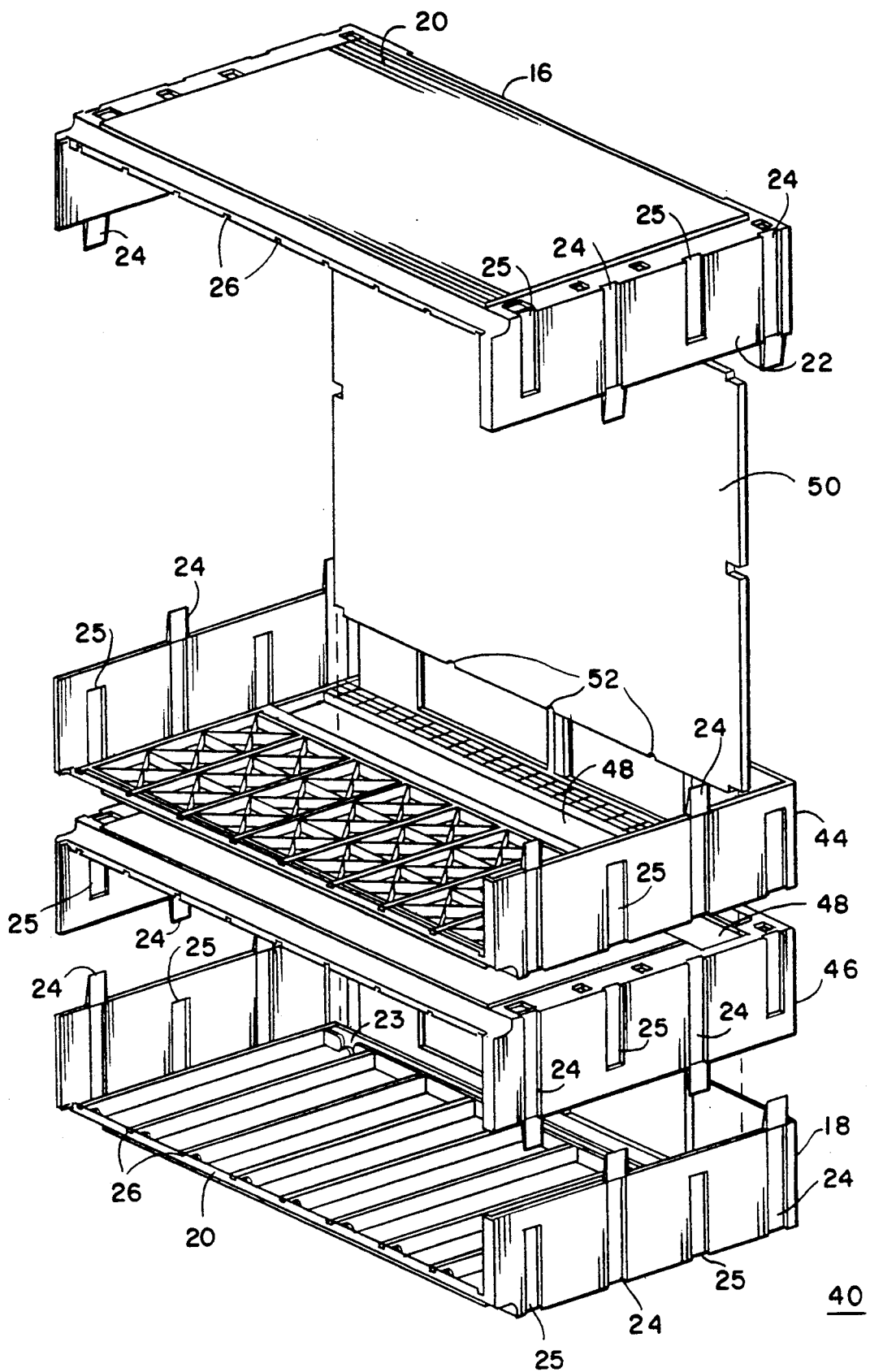
FIG. 7 is a perspective view of a double-height variation of the enclosure of FIG. 1.
Figure 8:
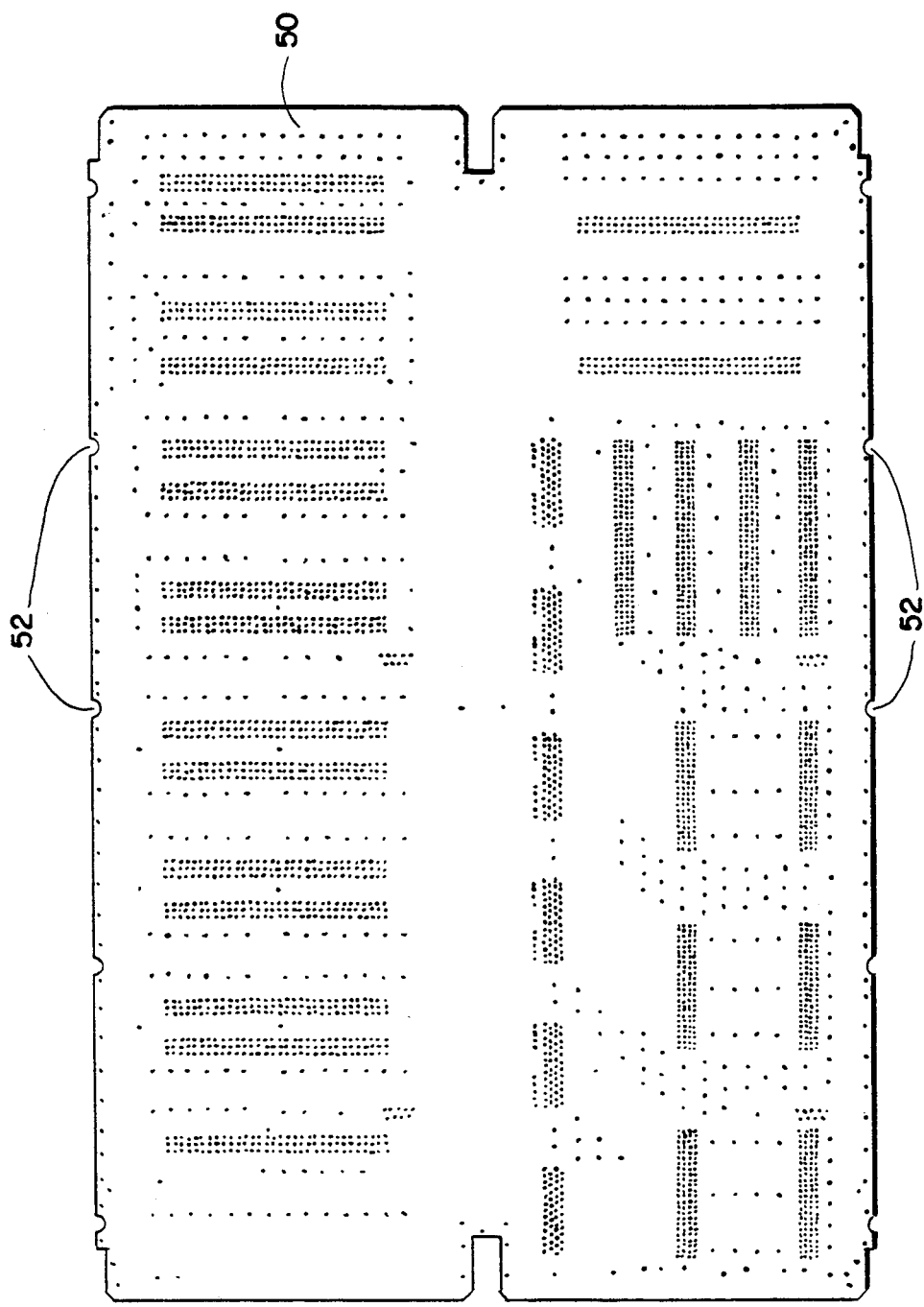
FIG. 8 is a representation of a double-height backplane for installation in the enclosure of FIG. 7.

The principles of the invention extend to variations of the above described enclosure 10. For example, referring to FIG. 7, there is shown a double-height enclosure 40 including four enclosure sections; the outer enclosure sections 16 and 18 of FIG. 1, and inner enclosure sections 44 and 46. All four enclosure sections 16, 18, 44, and 46 are manufactured according to the above described process. The two inner enclosure sections 44 and 46, however, further include slots 48 cut through their center portions at a location corresponding to the backplane channel 28 of outer enclosure sections 16 and 18 as shown in FIG. 2. The two inner enclosure sections 44 and 46 are bolted together (not shown), and latched to the outer enclosure section 18. A double height backplane 50, including recesses 52 shown in FIG. 8, is then inserted through the slots 48 such that the recesses 52 engage protrusions 23 as previously described. Outer enclosure section 16 is then latched around backplane 50, also such that protrusions 23 engage recesses 52. Again, an interference fit accurately positions and retains double-height backplane 50 within enclosure 40. This double-height enclosure 50 may be used, for example, for mounting disk drives which blind-mate with backplane connectors on the lower half of backplane 50, while also mounting card cages containing disk controller modules which blind-mate with backplane connectors on the top half of backplane 50. It is possible to add further inner enclosure sections like enclosure sections 44 and 46 for uses such as stacking multiple rows of disk drives.

It is apparent that, within the scope of the invention, modifications and different arrangements may be made other than as herein disclosed. The present disclosure is merely illustrative, the invention comprehending all variations thereof.

We claim:
1. An enclosure comprising:
a backplane having spaced apart recesses on opposing edges;
two flexible enclosure sections, each enclosure section comprising a center portion and end portions, such end portions extending laterally from the same side of the center portion, the center portion comprising alignment protrusions spaced apart to engage the backplane recesses and extending from the side of the center portion from which the end portions extend, the protrusions having, curved apex regions and a height greater than the depth of the recesses;
means that latch the end portions of the enclosure sections together, the enclosure sections being dimensioned such that the enclosure sections are closed around the backplane and the protrusions from the enclosure sections are urged against the recesses on the backplane.

2. The enclosure of claim 1, wherein the contact surfaces of the protrusions and recesses comprise an arcuate contour, and wherein the apex regions of the protrusions are more arcuate than the bottoms of the recesses.

3. The enclosure of claim 1, wherein the center portion of each enclosure section comprises a flat to convex contour.

4. The enclosure of claim 1, wherein the flexible enclosure section further comprises a backplane guide channel for receiving the backplane, the backplane guide channel projecting from the side of the center portion from which the end portions extend, the alignment protrusions being positioned within the guide channel.

5. The enclosure of claim 1, wherein the backplane further comprises a connector for mating with a connector on a module, and wherein the enclosure section further comprises a module guide rail for receiving the module, the module guide rail projecting from the side of the center portion from which the end portions extend and extending transverse of the backplane guide channel so that when a module is installed, the module connector will engage the backplane connector.

6. The enclosure of claim 1, wherein each enclosure section is constructed of single unit injection molded plastic.

7. The enclosure of claim 1, wherein the backplane is routed from a panel comprising multiple backplanes, and wherein the recesses are comprised of drilled holes in the panel.

8. An enclosure comprising:
a backplane comprising spaced apart recesses aligned on opposing edges, and a connector for mating with a connector on a module;
two flexible enclosure sections, each enclosure section being constructed of injection molded plastic and comprising a center portion and end portions, such end portions extending laterally from the same side of the center portion, the center portion comprising a convex contour and comprising a backplane guide channel projecting from the side of the center portion from which the end portions extend, the backplane guide channel comprising alignment protrusions spaced apart and dimensioned to fit the backplane recesses, and a module guide rail for receiving the module, the guide rail projecting from the side of the center portion from which the end portions extend, the module guide rail being transverse of the backplane guide channel so that when a module is installed, the module will engage the backplane connector;
means that latch the end portions of the enclosure sections together, the enclosure sections being effective such that the enclosure sections are closed around the backplane and the protrusions from the enclosure sections are urged against the recesses on the backplane.

9. An enclosure comprising:
a backplane having spaced apart recesses on opposing edges;
two flexible outer enclosure sections, each enclosure section comprising a center portion and end portions, such end portions extending laterally from the same side of the center portion, the center portions comprising alignment protrusions spaced apart to engage the backplane recesses and extending from the side of the center portion from which the end portions extend, the protrusions having curved apex regions and a height greater than the depth of the recesses;
a plurality of inner enclosure sections comprising a center portion and end portions, such end portions extending laterally from the same side of the center portion, the center portions including slots dimensioned to accept the backplane,
means that latch the end portions of the enclosure sections together, the inner enclosure sections being latched between the outer enclosure sections, the enclosure sections being dimensioned such that the enclosure sections are closed around the backplane and the protrusions from the outer enclosure sections are urged against the recesses on the backplane.

* * * * *